(12) United States Patent
Jia

(10) Patent No.: US 7,911,271 B1
(45) Date of Patent: Mar. 22, 2011

(54) HYBRID BROADBAND POWER AMPLIFIER WITH CAPACITOR MATCHING NETWORK

(76) Inventor: Pengcheng Jia, Thousand Oaks, CA (US)

( * ) Notice: Subject to any disclaimer, the term of this patent is extended or adjusted under 35 U.S.C. 154(b) by 72 days.

(21) Appl. No.: 12/332,317

(22) Filed: Dec. 10, 2008

Related U.S. Application Data

(60) Provisional application No. 61/013,997, filed on Dec. 14, 2007.

(51) Int. Cl.
*H03F 1/00* (2006.01)
(52) U.S. Cl. .......................................... 330/67; 330/307
(58) Field of Classification Search .................... 330/67, 330/302, 307
See application file for complete search history.

(56) References Cited

U.S. PATENT DOCUMENTS

| | | | | |
|---|---|---|---|---|
| 7,567,128 B2 * | 7/2009 | Oka et al. | ...................... | 330/302 |
| 7,626,471 B2 * | 12/2009 | Kishimoto et al. | ............ | 333/1.1 |
| 2004/0150489 A1 * | 8/2004 | Driver et al. | ..................... | 333/32 |

* cited by examiner

*Primary Examiner* — Henry K Choe

(57) ABSTRACT

A hybrid broadband power amplifier module design is disclosed. In a power amplifier design, low impedance transmission lines are typically needed at the input and output of the transistor to match for its optimum source and load impedance. The peripheral of the GaN (Gallium Nitride) transistor is very small due to the high power density of the GaN transistor. The transmission line, for example a microstrip line, needs to be very wide to achieve low impedance on ceramic substrates such as Alumina. The dimensional mismatch from the low impedance transmission line to the transistor causes additional parasitic effect to the matching networks and limits the bandwidth of the amplifier. Capacitor materials are typically very high in dielectric constant; hence a single layer capacitor with small dimensions equalizes to a low impedance transmission line. Selected capacitors with proper dimensions can be used as the low impedance transmission lines in the matching networks. They will have comparable width to the GaN transistor and minimize the parasitic effect. The wavelength inside the capacitor will also be very short due to the high dielectric constant; hence the matching network can be much shorter. A compact hybrid amplifier module has been built in a small package with the GaN transistor, capacitor matching networks and other necessary circuits inside. More than an octave bandwidth can be achieved with this new scheme.

4 Claims, 3 Drawing Sheets

HYBRID BROADBAND POWER AMPLIFIER WITH CAPACITOR MATCHING NETWORK

This application claim an invention disclosed in prior-filed provisional application (Application No. 61/013,997) filed Dec. 14, 2007.

BACKGROUND OF THE INVENTION

1. Field of Invention

This invention relates to a power amplifier module design using transistor, capacitor, matching network and package.

2. Description of Prior Art

A hybrid power amplifier typically includes a transistor, an input matching network and an output matching network. The input/output matching networks transform the input/output port impedance (typically 50 Ohm) to the optimum source/load impedance of the transistor to achieve the maximum output power. The matching networks typically need to have a characteristic impedance of a few Ohms to transform the port impedance to the optimum load impedance of a high power device. The input/output matching networks are typically printed on ceramic substrate such as Alumina ($Al_2O_3$). The bandwidth of the power amplifier is normally less than an octave since low impedance transmission lines are typically very wide and have large parasitic effect due to the dimensional mismatch with the small transistor die.

BRIEF SUMMARY OF THE INVENTION

Multi-section transmission line matching networks are typically used for broadband power amplifiers. The section closest to the power transistor normally has the lowest impedance. The line is typically very wide to achieve the low impedance on the common ceramic substrates, such as Alumina. However, GaN transistors are very small due to its high power density. The dimensional mismatch between the low impedance transmission line and transistor will add parasitic effect to the matching network and greatly limited the bandwidth of the amplifier.

A single layer capacitor typically uses high dielectric constant material which range from 30 to 1000 comparing to 10 of Alumina. On high dielectric constant material, low impedance transmission line has both small line width and length. The single layer capacitor can be used as a low impedance transmission line. The capacitor's value and dimension can be carefully selected to achieve the target impedance and phase length.

The wavelength inside the capacitors has been shortened due to the high dielectric constant. The length of the matching network is also reduced dramatically. All the matching networks and the transistor can fit into a small package to become a power amplifier module. The module can use either a plastic package or a ceramic package. A good heat spreader is needed on the bottom of the package to dissipate the heat generated by the transistor. The input/output port of the module can be matched to 50 Ohm. Other port impedance is also possible due to the requirement of different applications.

With the use of single layer capacitors as the matching network or part of the matching network, a small amplifier module with more than an octave bandwidth in C band has been built in a compact ceramic package.

BRIEF DESCRIPTION OF THE SEVERAL VIEW OF THE DRAWINGS

The foregoing features of the invention will be more readily understood by reference to the following detailed description taken with the accompanying drawings.

DETAILED DESCRIPTION OF THE INVENTION

The traditional high power transistors typically have very low optimum source and load impedance for maximum output power. GaN transistors have very high breakdown voltage and hence have higher optimum source/load impedance comparing to the sub-Ohm impedance from conventional transistors such as GaAs FET or Silicon LDMOS. However, the optimum source and load impedance is still low for high power GaN devices. Especially the real part of the optimum source impedance being in the range of only a few Ohms for a GaN device with more than 10 Watts of output power capability.

Multi-section transmission line matching networks are typically used for broadband power amplifiers. The matching network has several sections. Each section is around quarter lambda in length (lambda is the wavelength on the substrate at the center frequency). The matching network transforms the port impedance (typically 50 Ohm) to the optimum source and load impedance. The section closest to the power transistor normally has the lowest impedance.

When the low impedance transmission line, normally microstrip line, is printed on a common ceramic substrate such as Alumina, the line is very wide. On a 5 mil thick Alumina substrate, a 5 Ohm impedance microstrip line has a width of greater than 100 mil. However, because the power density is very high, the peripheral of the GaN device is very small. The bonding pad on a 10 Watt GaN device is less than 20 mil. Due to the dimensional mismatch from the low impedance line to the small device, a parasitic inductance is added to the matching network, greatly reducing the bandwidth of the amplifier.

Figure 1:
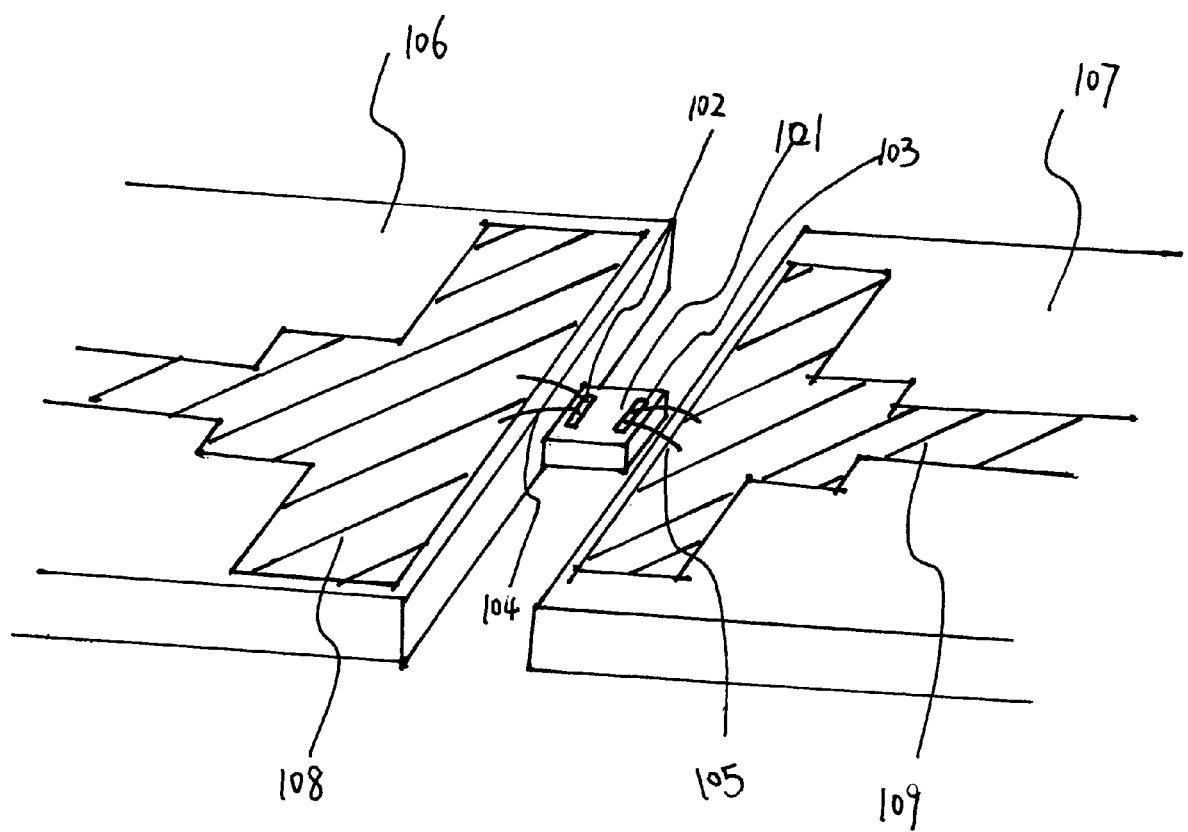
FIG. 1 is an amplifier disclosed in prior arts.

FIG. 1 shows a prior art amplifier design with a transistor 101 and matching networks 108 and 109 printed on Alumina substrate 106 and 107 respectively. The matching networks have multiple sections, with the section next to the transistor having the lowest impedance and largest line width. The transmission lines next to the transistor are greatly wider than the bonding pads 102 and 103 on the transistor 101. The transistor connects to the middle of the matching network 108 and 109 by bonding wire 104 and 105. The dimensional mismatch from transmission line 108 to pad 102 and from line 109 to pad 103 add parasitic effects that greatly limit the bandwidth of the amplifier.

A single layer capacitor is a type of capacitor with a dielectric material between top and bottom plating. It typically uses high dielectric constant material. The dielectric constant ranges from 30 to 1000 or even higher. The high dielectric constant material can help to create low impedance transmission line with small dimensions. The capacitor can have a width similar to the GaN transistor and achieves very low characteristic impedance as a transmission line. The value of the capacitor can be carefully selected, so that it can be treated as a section of transmission line with low impedance and proper phase delay.

The capacitor can also be a gap cap or other type of capacitor. The gap cap has a gap between the pads on the top. It can be used as it is, or bond wires can connect the 2 pads. Customized capacitor with desired width and length can also be manufactured as the matching network.

In a multi-section matching network, the sections of transmission lines that are further away from the transistor typically has much higher impedance and the common ceramic substrate such as Alumina can still be used to reduce the cost.

Figure 2:
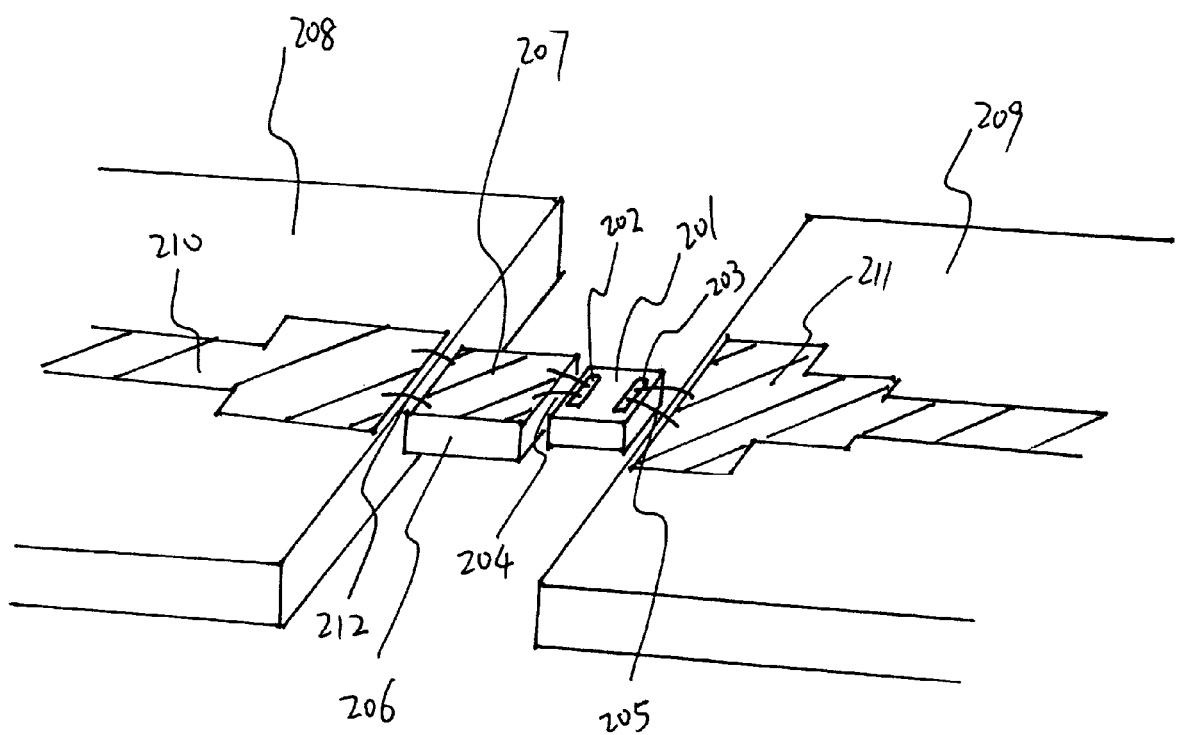
FIG. 2 is the perspective view of the amplifier with capacitor match.

FIG. 2 shows a hybrid amplifier design with a capacitor 206 on the input of a transistor 201 to function as a section of low impedance line. Additional input matching network 210 is still printed on Alumina substrate 208 to further transform the impedance to match with input port impedance (50 Ohm). However, the line width of 210 has been reduced greatly and can match with the width of the capacitor 206 properly. The capacitor 206 uses high dielectric constant substrate and has plating 207 on the top. It connects to the input pad 202 of the transistor 201 by bonding wire 204 and connects to additional matching network 210 by bonding wire 212. In this design, an output matching network 211 is printed on a ceramic substrate 209. It connects to the output pad 203 of the transistor 201 by bonding wire 205.

Multiple capacitors can be used in serial or parallel at the input and output of the transistor 201 to achieve the best performance.

A capacitor matching network can be used on the output side of the transistor 201 too. The output matching network 211 can also be printed on a high dielectric constant capacitor material. The input matching network 210 can be integrated together with capacitor 206 on a customized capacitor substrate.

Figure 3:
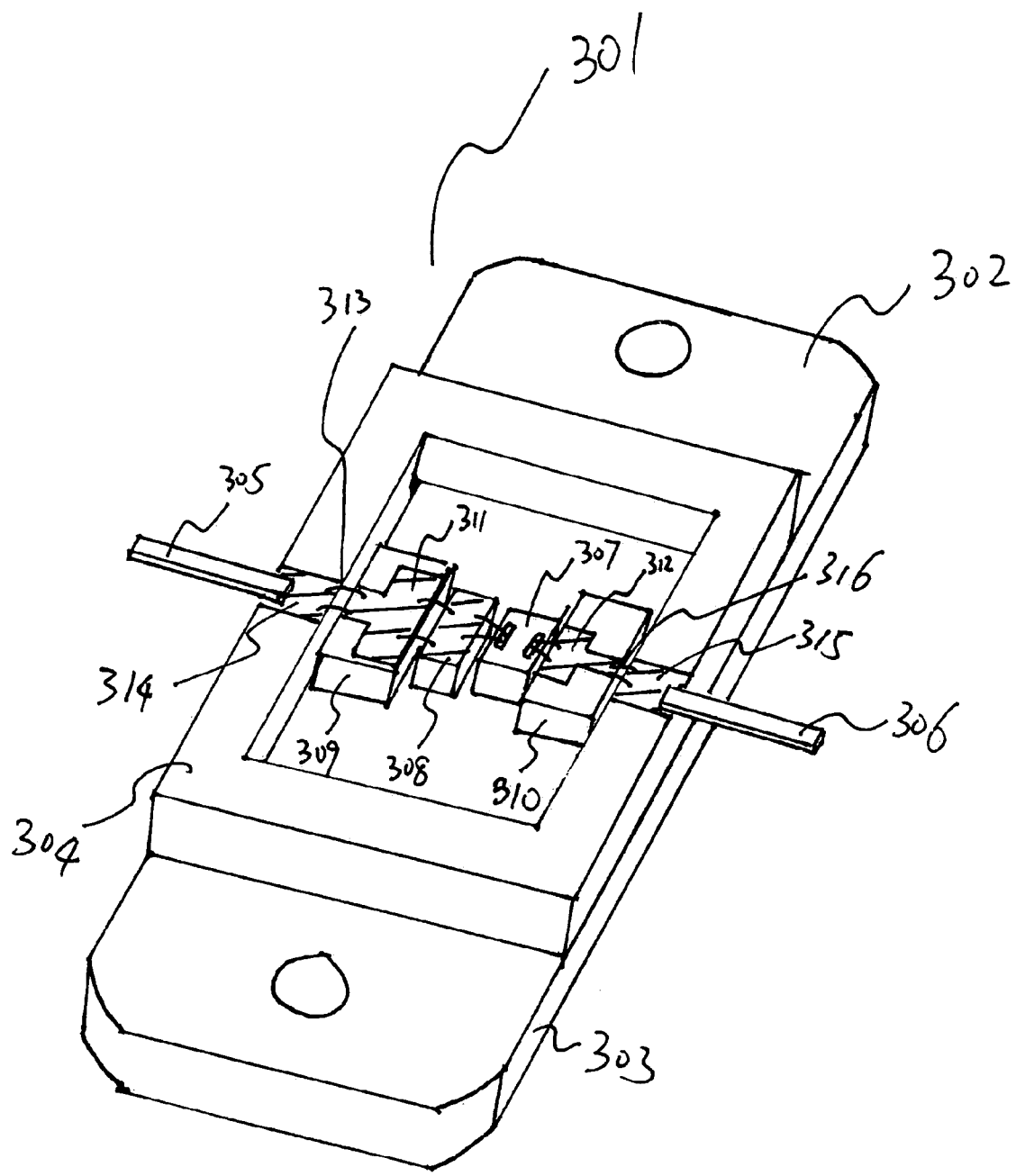
FIG. 3 is the perspective view of the power amplifier module that includes the capacitor match and a package.

FIG. 3 shows a high power broadband power amplifier module 301. In 301, a ceramic package 302 is used to accommodate the transistor 307, the capacitor 308, additional input matching network 311 and output matching network 312.

The ceramic package has a metal base for effective heat dissipation and a ceramic ring frame 304 disposed on top of the metal base 303. Input/output leads 305 and 306 are attached to the metal pads on ceramic ring frame 304. The pads 314 and 315 connect to circuits inside the package by bonding wire 313 and 316 respectively.

The transistor and matching networks are the same as the preferred embodiment shown in FIG. 2. The transistor 307 connects a capacitor 308 from its input pad. Additional matching network 311 is printed on a ceramic substrate 309 and connects to the capacitor and package by bonding wires respectively. Output matching network 312 is printed on a ceramic substrate 310. It connects to the output pad of the transistor on one side and the package on the other side by bonding wires.

A high power amplifier module with more than an octave bandwidth has been achieved at C band with a GaN transistor and capacitor matching network. Good performance at higher frequencies with the same design approach has also been achieved.

The same design approach can be used for both a GaN transistor and other conventional transistors, such as Silicon LDMOS, GaAs FET, HBT and HEMT, to achieve both high power and broad bandwidth. It can also be used for many new types of transistors, such as SiC and InP.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

I claim:

1. A compact hybrid broadband amplifier module comprising:
   a package; a transistor;
   an input matching network and an output matching network;
   at least one single layer capacitor disposed between the transistor and the input matching network functioning as a quarter wavelength impedance transformer, wherein the single layer capacitor is chosen with its width similar to the width of the transistor and the transmission line in the input matching network, and its length around quarter wavelength at the center of the operational frequency.

2. The module of claim 1, wherein said capacitor functions as an impedance transformer with its length different from quarter wavelength at the center of the operational frequency.

3. A compact hybrid broadband amplifier comprising:
   a transistor;
   an input matching network and an output matching network comprising
   at least one single layer capacitor disposed between the transistor and the input matching network functioning as a quarter wavelength impedance transformer, wherein the single layer capacitor is chosen with its width similar to the width of the transistor and the transmission line in the input matching network and its length around quarter wavelength at the center of the operational frequency.

4. The amplifier of claim 3, wherein said capacitor functions as an impedance transformer with its length different from quarter wavelength at the center of the operational frequency.

* * * * *